(12) United States Patent
Parkhurst

(10) Patent No.: US 7,078,962 B2
(45) Date of Patent: Jul. 18, 2006

(54) DYNAMIC CURRENT GENERATOR WITH ASYMMETRIC COMMON-MODE INPUT RANGE

(75) Inventor: Charles Parkhurst, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/421,970

(22) Filed: Apr. 23, 2003

(65) Prior Publication Data

US 2004/0212425 A1 Oct. 28, 2004

(51) Int. Cl.
*G06G 7/12* (2006.01)
(52) U.S. Cl. .......................................... 327/563; 327/66
(58) Field of Classification Search .................. 327/65, 327/66, 560, 563, 50, 103, 96; 330/252, 330/257, 261, 267, 273, 285, 296, 288
See application file for complete search history.

(56) References Cited

U.S. PATENT DOCUMENTS

| 5,512,859 | A | * | 4/1996 | Moraveji | 330/267 |
| 5,610,557 | A | * | 3/1997 | Jett, Jr. | 330/261 |
| 5,729,177 | A | * | 3/1998 | Goutti | 330/257 |
| 5,909,136 | A | * | 6/1999 | Kimura | 327/563 |
| 6,127,868 | A | * | 10/2000 | Phillips | 327/66 |
| 6,549,070 | B1 | * | 4/2003 | Tran et al. | 330/252 |

* cited by examiner

*Primary Examiner*—Long Nguyen
(74) *Attorney, Agent, or Firm*—Frederick J. Telecky, Jr.; W. James Brady, III

(57) ABSTRACT

A dynamic current generator 30 is disclosed in which a common-mode input range is provided which is asymmetric toward the bottom rail VEE. An embodiment of the invention is also disclosed used in an asymmetrical dynamically biased amplifier system 34.

6 Claims, 4 Drawing Sheets

DYNAMIC CURRENT GENERATOR WITH ASYMMETRIC COMMON-MODE INPUT RANGE

TECHNICAL FIELD

The invention relates to dynamic biasing systems in electronic devices. More particularly, the invention relates to methods, circuits, and systems for dynamic biasing in applications having an asymmetric input range.

BACKGROUND OF THE INVENTION

In many applications requiring high speed, low noise, and low distortion operational amplifier circuits, dynamic biasing has become a necessity. With a class A amplifier circuit having a pair of differential inputs, for example, dynamic biasing provides more full power bandwidth without increased susceptibility to noise. Under such circumstances, dynamic biasing is able to provide lowered distortion at high operating frequencies without increasing the noise in the input stage. Devices providing dynamic biasing are commercially available in the arts.

A representative example of a dynamic biasing circuit is depicted in FIG. 1 (prior art). The dynamic input range of the prior art circuit of FIG. 1 may be expressed as:

$$VEE + VCE_{SAT} + VBE \leq V_{IN\ DYN} \leq VCC - VCE_{SAT} - VBE \quad \text{[Equation 1]}.$$

A graphical representation of the input common-mode range of the circuit of FIG. 1 is also shown in FIG. 2. From the example of the prior art, it can be seen that the input common-mode range of the dynamically biased circuit is bounded by VBE+VCE within the top rail VCC=5V, and bottom rail VEE=0V, respectively. Thus, the dynamically biased amplifier circuit familiar in the arts is limited by its input common-mode range symmetry.

Asymmetric dynamic biasing would be useful in the arts and would provide many advantages. The advantages of asymmetric dynamic biasing include, but are not limited to, particular utility in amplifier applications where it is desirable for the common-mode range to approach or meet the bottom rail. Additional advantages would accrue, such as the extension of low noise, low distortion, and increased slew rates to circuits operating within the lower regions of their input common-mode ranges.

SUMMARY OF THE INVENTION

In carrying out the principles of the present invention, in accordance with exemplary embodiments thereof, methods and associated systems and circuits for asymmetric dynamic biasing are described.

According to one aspect of the invention, bipolar transistors are coupled to differential input voltages in a circuit adapted to provide an output current described by the formula:

$$I_{out} = I_B(e^{Vd/2VT} + e^{-Vd/2VT}) \quad \text{[Equation 3]}.$$

According to another aspect of the invention, an example of an amplifier system is disclosed in which a folded cascode is provided with an asymmetrical dynamic bias current.

The invention provides technical advantages including but not limited to an asymmetric dynamic range, increased slew rate, high speed, low noise, and low distortion. These and other features, advantages, and benefits of the present invention will become apparent to one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the figures unless otherwise noted. Like numerals refer to like parts throughout the various figures. Descriptive and directional terms used in the written description such as upper, lower, left, right, etc., refer to the drawings themselves as laid out on the paper and not to physical limitations of the invention unless specifically noted. The drawings are not to scale, and some features of embodiments shown and discussed are simplified or exaggerated for illustrating the principles, features, and advantages of the invention.

DETAILED DESCRIPTION OF PREFERRED EMBODIMENTS

The invention provides an asymmetric dynamic current generator particularly useful for biasing amplifier input stages. The methods, circuits, and systems of the invention include the bottom rail within the input common-mode range without compromising noise, distortion, or slew rate.

Figure 1:
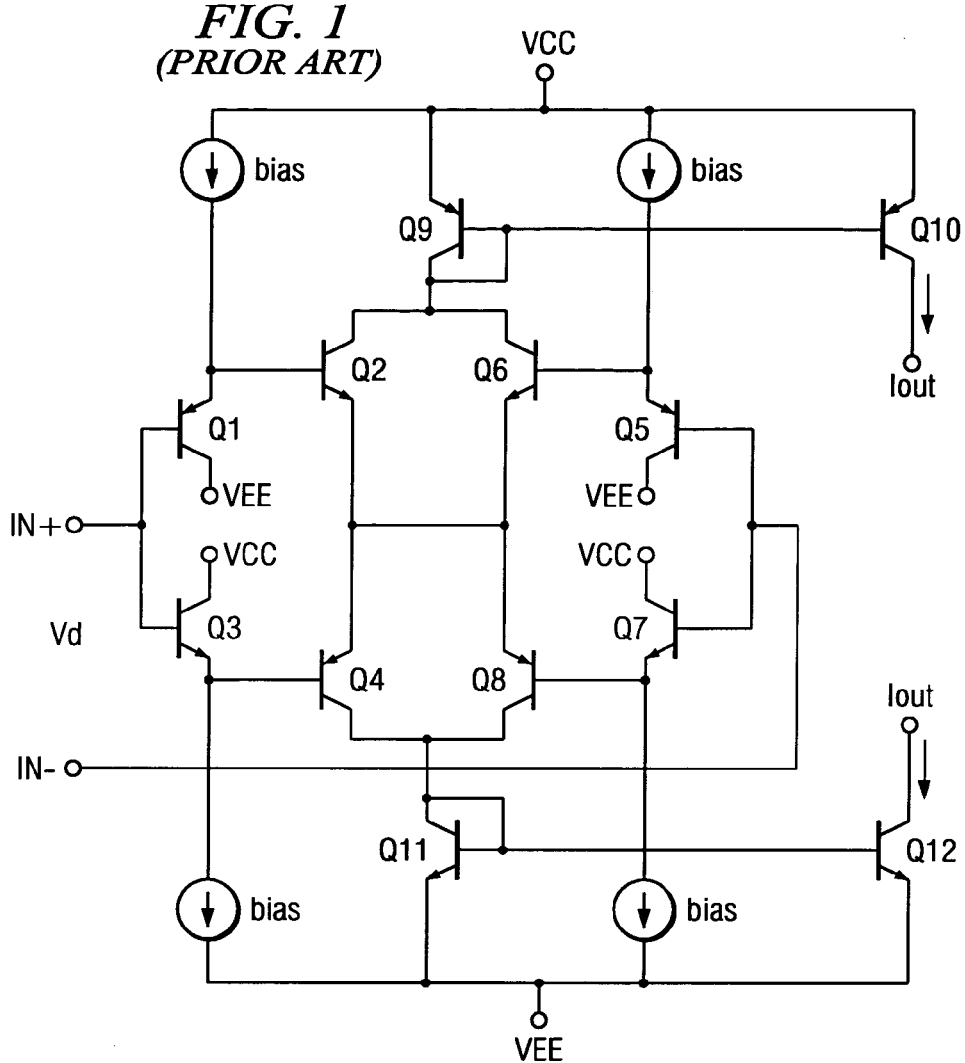
FIG. 1 (prior art) is an example of a dynamic biasing circuit known in the arts.
Figure 2:
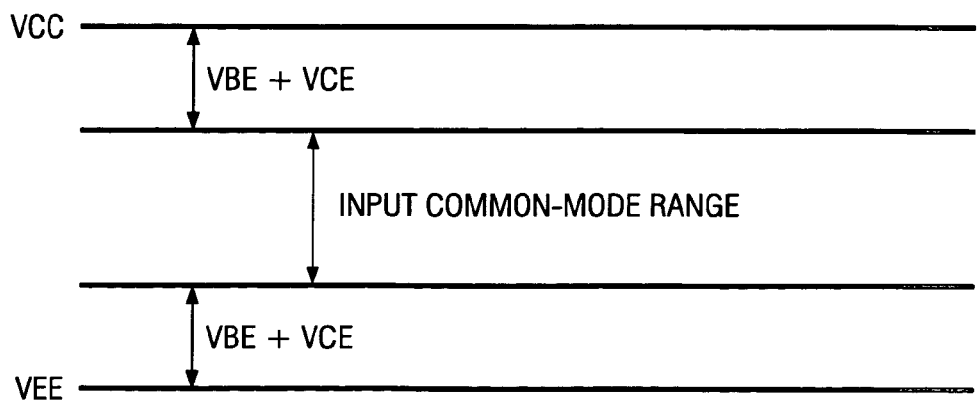
FIG. 2 (prior art) is a graphical representation of a typical input common-mode range of a prior art circuit as shown in the example of FIG. 1.
Figure 3:
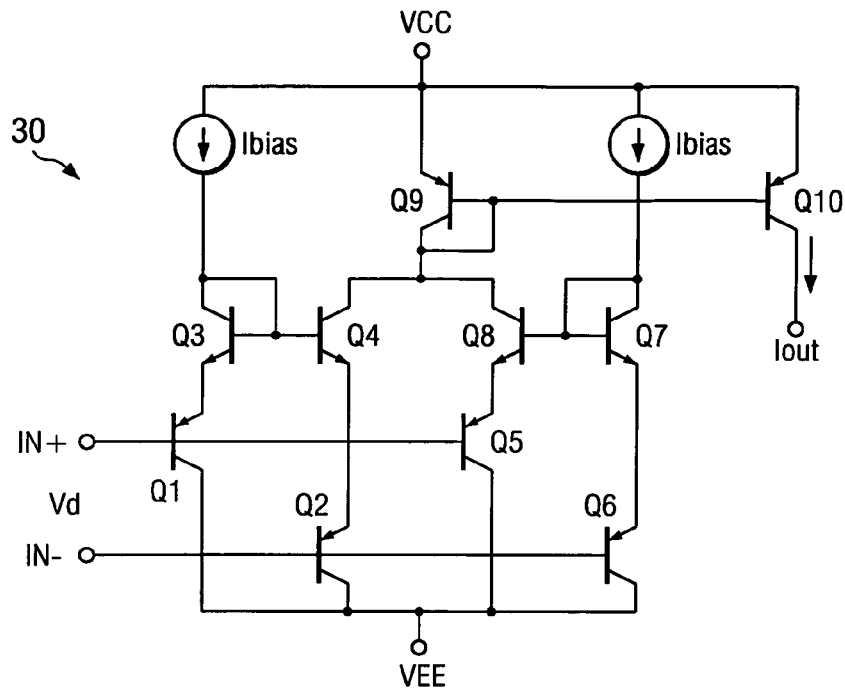
FIG. 3 is an example of an asymmetric dynamic bias circuit according to a preferred embodiment of the invention.

Referring now primarily to FIG. 3, a circuit 30 example is shown in which the positive input IN+ and the negative input IN− may create a differential input voltage $V_d$. The input dynamic range for the circuit 30 of FIG. 3 may be expressed as:

$$VEE - VBE + VCE_{SAT} \leq V_{IN\ CM} \leq VCC - 2VBE - VCE_{SAT} \quad \text{[Equation 2]}.$$

It should be understood that the input common-mode range of the circuit 30 is asymmetric, and includes the bottom rail VEE.

Figure 4:
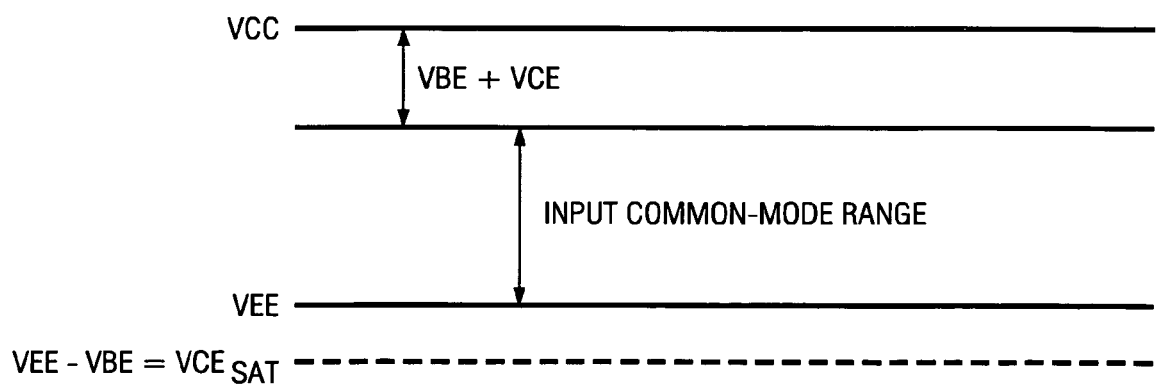
FIG. 4 is a graphical representation of the input common-mode range of the circuit example shown in FIG. 3.

A graphical representation of the input common-mode range of the circuit 30 depicted in FIG. 3 is presented in FIG. 4. The input common-mode range of the asymmetrically dynamically biased circuit 30 of FIG. 3 is bounded by 2VBE+VCE within the top rail, VCC, but is not affected at the bottom rail, VEE. In this example, VCC=5V, and VEE=0V, but it should be understood that other values could be used depending on the desired characteristics and application of the circuit.

Those skilled in the arts will appreciate that the circuit of FIG. 3 produces an output current $I_{out}$ that is exponentially dependent upon the differential voltage $V_d$ across the inputs IN+ and IN−. The input transistors, Q1 for the positive input IN+, and Q2 for the negative input IN−, each have a substantially identical biasing current, herein denominated $I_B$. Additionally, the positive and negative differential input transistors, Q1, Q2, possess substantially identical thermal voltages, $V_T$. The output current $I_{out}$ relationship with the differential voltage $V_d$ across the inputs IN+ and IN− may be expressed:

$$I_{out}=I_B(e^{Vd/2VT}+e^{-Vd/2VT})  \quad \text{[Equation 3]}.$$

The relationship of Equation 3 may alternatively be expressed:

$$I_{out}=2I_B\cosh(V_d/2V_T) \quad \text{[Equation 4]}.$$

Figure 5:
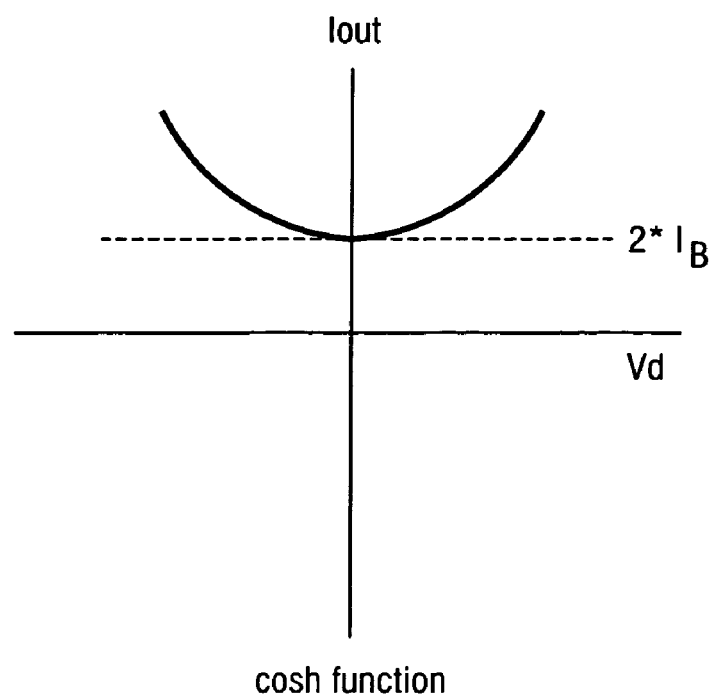
FIG. 5 is a graphical representation of an input and output response typical of the exemplary circuit of FIG. 3.

FIG. 5 depicts a graphical representation of the output current $I_{out}$ of the circuit example of FIG. 3, versus the differential input voltage $V_d$ across the inputs IN+ and IN−. It can be observed from FIG. 5 that the output current $I_{out}$ increases exponentially with both positive and negative differential voltages $V_d$.

Figure 6:
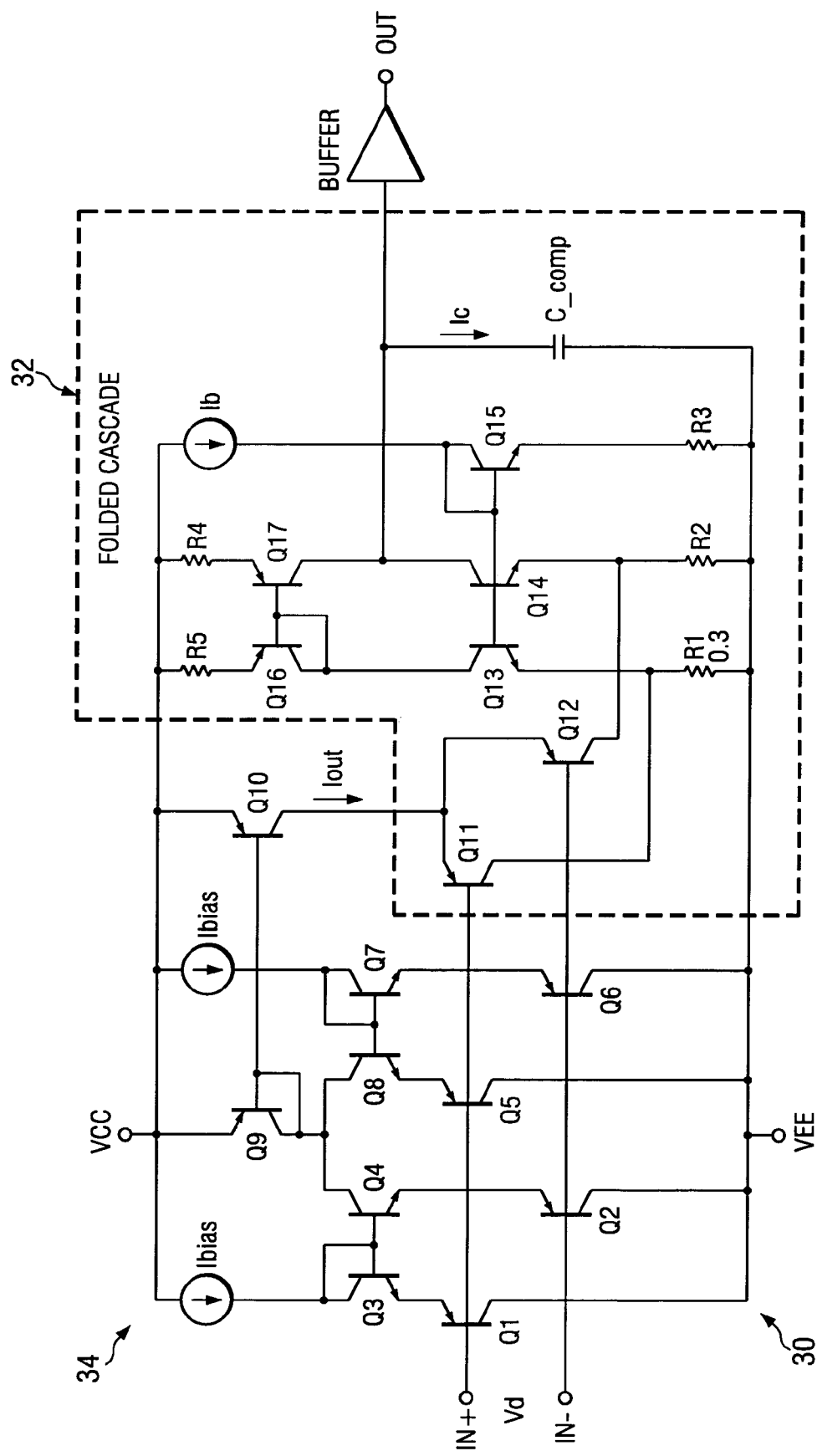
FIG. 6 is an example showing the use of an embodiment of the invention with an asymmetrically biased folded cascode input.

FIG. 6 shows a preferred embodiment of the invention with a circuit 30 according to the example of FIG. 3 coupled to a PNP folded cascode circuit 32 known generally in the arts. The resulting combination is a fast, low noise, low distortion amplifier system 34 that can accept differential input signals, IN+, IN−, within an input range extending to the bottom rail VEE. The low noise is attributable to the zero transconductance at small signal, as seen in FIG. 5. Any noise generated in the asymmetric dynamic bias generator circuit 30 is thus not amplified. In addition to the property of exhibiting zero transconductance, the dynamic current source $I_{out}$ feeding the differential input pair Q11, Q12, of the folded cascode 32 is biasing a common-mode point. As a result, no noise is transferred to the input stage circuit 32 and the total noise of the system 34 is a result of the input stage 32 alone.

Figure 7:
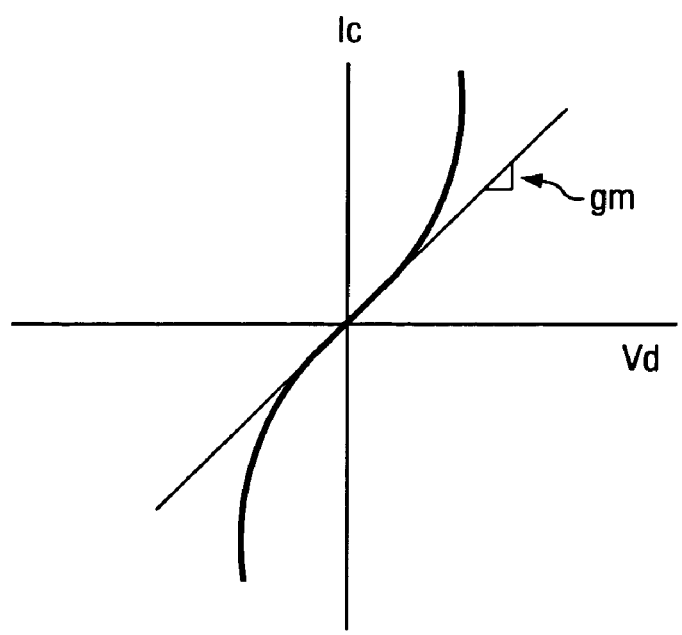
FIG. 7 is a graphical example of an input and output response of the circuit of FIG. 6.

FIG. 7 graphically illustrates the output current of the circuit configuration of FIG. 6, taken at the compensation capacitor, $I_C$, versus the differential voltage $V_d$. It can be seen that the current $I_C$ delivered to the compensation capacitor $C_{comp}$ of FIG. 6 can be very high dependent upon the magnitude of the voltage differential $V_d$ of the positive and negative input signals, IN+, IN−, respectively. The rapid charging of the compensation capacitor $C_{comp}$ gives an indication of the increased slew rate possible using the invention.

Thus, the invention provides a novel asymmetric dynamic bias generator useful in applications where it is desirable to provide an asymmetric dynamic input range. An example of how an embodiment of the invention may be used in combination with a folded cascode to produce a high performance op amp circuit demonstrates the high slew rate, low distortion, and low noise capabilities of the invention. While the invention has been described with reference to certain illustrative embodiments, the description of the methods and devices described are not intended to be construed in a limiting sense. Various modifications and combinations of the illustrative embodiments as well as other advantages and embodiments of the invention will be apparent to persons skilled in the art upon reference to the description and claims.

I claim:

1. A circuit comprising:
   a first bipolar transistor having a base coupled to a positive input node;
   a second bipolar transistor having a base coupled to a negative input node;
   a third bipolar transistor having a collector and a base coupled together and having an emitter coupled to an emitter of the first bipolar transistor;
   a fourth bipolar transistor having a base coupled to the base of the third bipolar transistor and having an emitter coupled to an emitter of the second bipolar transistor;
   a fifth bipolar transistor having a base coupled to the positive input node;
   a sixth bipolar transistor having a base coupled to the negative input node;
   a seventh bipolar transistor having a collector and a base coupled together and having an emitter coupled to an emitter of the sixth bipolar transistor;
   an eighth bipolar transistor having a base coupled to the base of the seventh bipolar transistor;
   a ninth bipolar transistor having collector and a base coupled together, the collector and base further coupled to a collector of the fourth bipolar transistor and a collector of the eighth bipolar transistor;
   a tenth bipolar transistor having a base coupled to the base of the ninth bipolar transistor;
   a first current source coupled to the collector of the third bipolar transistor and to an emitter of the ninth bipolar transistor;
   a second current source coupled to the emitter of the ninth bipolar transistor, and to the collector and base of the seventh bipolar transistor, and to an emitter of the tenth bipolar transistor; and
   a current output node defined by a collector of the tenth bipolar transistor for outputting a dynamic bias current.

2. A circuit according to claim 1 wherein the first, second, fifth, sixth, ninth, and tenth bipolar transistors consist of PNP transistors, and the third, fourth, seventh, and eighth bipolar transistors consist of NPN transistors.

3. An asymmetrically dynamically biased amplifier system comprising:
   a first bipolar transistor having a base coupled to a positive input node;
   a second bipolar transistor having a base coupled to a negative input node;
   a third bipolar transistor having a collector and a base coupled together and having an emitter coupled to an emitter of the first bipolar transistor;
   a fourth bipolar transistor having a base coupled to the base of the third bipolar transistor and having an emitter coupled to an emitter of the second bipolar transistor;
   a fifth bipolar transistor having a base coupled to the positive input node;
   a sixth bipolar transistor having a base coupled to the negative input node;
   a seventh bipolar transistor having a collector and a base coupled together and having an emitter coupled to a collector of the sixth bipolar transistor;
   an eighth bipolar transistor having a base coupled to the base of the seventh bipolar transistor;
   a ninth bipolar transistor having collector and a base coupled together, the collector and base further coupled to a collector of the fourth bipolar transistor and a collector of the eighth bipolar transistor;
   a tenth bipolar transistor having a base coupled to the base of the ninth bipolar transistor;

a first current source coupled to the collector of the third bipolar transistor and to an emitter of the ninth bipolar transistor;

a second current source coupled to the emitter of the ninth bipolar transistor, and to the collector and base of the seventh bipolar transistor, and to an emitter of the tenth bipolar transistor;

a current output node defined by a collector of the tenth bipolar transistor; and a folded cascode circuit comprising a first differential input transistor with a base coupled to the positive input node, and having an emitter coupled to the current output node, and a second differential input transistor with a base coupled to the negative input node, and having an emitter coupled to the current output node;

whereby the current output node is operative to asymmetrically dynamically bias the folded cascode circuit.

4. A system according to claim 3 wherein the first, second, fifth, sixth, ninth, tenth, and differential pair bipolar transistors consist of PNP transistors, and the third, fourth, seventh, and eighth bipolar transistors consist of NPN transistors.

5. An asymmetric dynamic current generator comprising:
an input portion;
a current mirror portion; and
a central portion operably coupling the input portion and the current mirror portion whereby an input asymmetric common-mode input of the generator approaches a bottom rail of the generator;
wherein the input portion includes,
a first bipolar transistor having a base coupled to a positive input node;
a second bipolar transistor having a base coupled to a negative input node;
a fifth bipolar transistor having a base coupled to the positive input node; and a sixth bipolar transistor having a base coupled to the negative input node,
wherein the central portion comprises:
a third bipolar transistor having a collector and a base coupled together and having an emitter coupled to an emitter of the first bipolar transistor;
a fourth bipolar transistor having a base coupled to the base of the third bipolar transistor and having an emitter coupled to an emitter of the second bipolar transistor;
a seventh bipolar transistor having a collector and a base coupled together and having an emitter coupled to a collector of a sixth bipolar transistor;
an eighth bipolar transistor having a base coupled to the base of the seventh bipolar transistor;
a first current source coupled to the collector of the third bipolar transistor and to an emitter of a ninth bipolar transistor; and
a second current source coupled to the emitter of the ninth bipolar transistor, and to the collector and base of the seventh bipolar transistor, and to an emitter of a tenth bipolar transistor.

6. The asymmetric dynamic current generator according to claim 5 wherein the current mirror portion comprises:
the ninth bipolar transistor having a collector and a base coupled together, the collector and base further coupled to a collector of the fourth bipolar transistor and a collector of the eighth bipolar transistor;
the tenth bipolar transistor having a base coupled to the base of the ninth bipolar transistor; and
a current output node defined by a collector of the tenth bipolar transistor for outputting an output current.

* * * * *